US006440826B1

(12) United States Patent
Buynoski

(10) Patent No.: US 6,440,826 B1
(45) Date of Patent: Aug. 27, 2002

(54) NISI CONTACTING EXTENSIONS OF ACTIVE REGIONS

(75) Inventor: Mathew S. Buynoski, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/785,176

(22) Filed: Feb. 20, 2001

(51) Int. Cl.[7] ............................................. H01L 21/425
(52) U.S. Cl. ..................... 438/528; 438/197; 438/407; 438/586; 438/592; 438/652
(58) Field of Search .................. 438/162, 197, 438/290, 299, 300, 657, 301, 303, 305, 306, 307, 403, 405, 407, 430, 520, 523, 528, 533, 581, 585, 586, 589, 592, 595, 597, 649, 651, 652, 655, 656

(56) References Cited

U.S. PATENT DOCUMENTS 5,418,174 A * 5/1995 Kalnitsky .................. 438/384
6,225,177 B1 * 5/2001 Tseng ........................ 438/305

* cited by examiner

Primary Examiner—Chandra Chaudhari
Assistant Examiner—Jack Chen
(74) Attorney, Agent, or Firm—McDermott, Will & Emery

(57) ABSTRACT

Smaller active regions are enabled by forming nickel suicide extensions from the nickel silicide layers on the source/drain regions and landing contacts on the nickel silicide extensions. The nickel silicide extensions are formed by implanting Si ions in the field oxide areas adjacent to the active regions, prior to depositing Ni, to catalyze the reaction of Ni and Si during annealing to form a nickel silicide layer that extends from the source/drain regions onto the Si-implanted field oxide areas. In an embodiment of the present invention, the nickel silicide is NiSi.

14 Claims, 3 Drawing Sheets

NISI CONTACTING EXTENSIONS OF ACTIVE REGIONS

FIELD OF THE INVENTION

The present invention relates to a method of manufacturing high-density integrated semiconductor devices exhibiting nickel silicide extensions off of the source/drain regions for landing contacts.

BACKGROUND ART

Conventional semiconductor devices comprise a substrate and various electrically isolated regions, called active regions, in which individual circuit components, such as transistors comprising gates and source/drain regions, are formed and interconnected. In one interconnection scheme, source/drain regions and gates of neighboring transistors are connected to one another by local interconnections to form standard cells which, in turn, are connected to each other locally and globally by several patterned metal layers interleaved with insulating layers formed above and extending substantially horizontally with respect to the substrate surface. The metal layers are connected to one another and to the local interconnection by contacts landed on the active areas on which metal silicide layers have been formed.

Current demands for high density and performance associated with ultra large scale integration require feature designs of about 0.25 micron and under, increased transistor and circuit speeds and improved reliability. Meeting increased performance and reliability demands require device features, e.g., transistor source/drain regions and gate electrodes, to be manufactured with high precision and uniformity. Achieving precise and uniform manufacturing while reducing design features in order to accommodate increased density demands challenges the limitations of conventional contact and interconnection technology.

In order to form local interconnects involving transistors, the active regions, e.g., the source/drain regions, must be of a sufficient size to land the contacts on the desired area to form a junction while also placing the contact at a location relative to the gate electrode that falls within a predetermined tolerance distance required for the transistor to function properly. However, larger active areas have higher source/drain capacitance, which undesirably interferes with semiconductor performance.

Consequently, reducing the size of the source/drain region in order to achieve increased design density and to reduce source/drain capacity is limited using conventional technology by the area required to land the contacts to form local interconnects.

Additional challenges arise as device sizes decrease. For example, as gate electrode lengths are scaled down, the source and drain junctions and polycrystalline silicon line width must also be scaled down. However, scaling down the source and drain junctions and polycrystalline line width increases parasitic resistance in the source and drain diffusion layers and the gate electrode, and also increases the sheet and contact resistance of the gate electrode and source/drain regions.

Salicide technology comprises forming metal silicide layers on the source/drain regions and/or on the gate electrode of a semiconductor device in a self-aligned manner. Salicide technology reduces parasitic sheet and contact resistance in the source and drain diffusion layers and the gate electrode that results from scaling down the source and drain junctions and polycrystalline silicon line width.

Silicides are typically formed by reacting a metal with silicon (Si). This is accomplished by heating, e.g., rapid thermal annealing, the wafer to a reaction temperature for a period of time sufficient for the metal layer to react with underlying Si to form a metal silicide layer on the source/drain regions and the gate electrode.

Various metals react with Si to form a metal silicide, however, titanium (Ti) and cobalt (Co) are currently the most common metals used. Recently, attention has turned towards nickel (Ni) to form nickel silicide utilizing salicide technology because nickel silicide avoids many limitations associated with $TiSi_2$ and $CoSi_2$. The formation of nickel silicide requires less Si than $TiSi_2$ and $CoSi_2$. Nickel silicide also exhibits almost no linewidth dependence on sheet resistance. Nickel silicide is normally annealed in a one step process, vis-a-vis a process requiring an anneal, an etch, and a second anneal, as occurs in $TiSi_2$ and $CoSi_2$ saliciding. In addition, nickel silicide exhibits lower film stress, i.e., causes less wafer distortion, than conventional Ti or Co silicides.

Although the use of Ni in salicide technology has certain advantages over using Ti or Co, there are problems associated with Ni. Metal silicide resistivity and, thus, semiconductor device performance, varies based on whether the silicide is metal-rich. Low resistivity is the preferred phase for metal silicides, including nickel silicide, as it improves device performance in the areas of switching speed and source to drain drive current. The transformation to a low resistivity nickel silicide, e.g, NiSi, is affected by the temperature at which annealing occurs. In order to form NiSi, annealing typically must occur at 400° C. or greater. However, at these temperatures, the annealing causes nickel suicide to creep out of the active regions.

There exists a need to reduce the size of the active areas in order to achieve improved design density while enabling the formation of the desired contact junction and the landing of contacts at the proper tolerance distance from the gate electrode.

DISCLOSURE OF THE INVENTION

The above-mentioned needs and other needs are met by embodiments of the present invention, which provide a method of manufacturing high-density integrated semiconductor devices exhibiting nickel silicide extensions off of the source/drain regions for landing contacts, the method comprising forming a silicon substrate, forming a gate dielectric layer on the silicon substrate, and a gate electrode on the gate dielectric layer, forming sidewall spacers adjacent to the side surfaces of the gate electrode, forming source/drain regions, applying a mask with openings over field oxide areas in the silicon substrate adjacent to the outside edges of the source/drain regions, implanting Si into the exposed portions of the field oxide areas, depositing nickel over the wafer, heating the wafer to react the nickel with Si from the gate electrode, source/drain regions and Si-implanted field oxide areas to form a nickel silicide layer on the gate electrode, nickel silicide layers on the source/drain regions and nickel silicide extensions on the field oxide areas implanted with Si, removing unreacted nickel from the wafer, and landing contacts on the nickel silicide extensions at tolerance distances between the contact and the gate electrode and the contact and the end of the nickel silicide extension. In an embodiment of the present invention, the nickel silicide is NiSi.

An advantage of the present invention is the ability to improve design density by reducing the size of the active areas. The present invention enables the reduction of the active regions by landing contacts, in whole or in part, on the nickel silicide extensions, while maintaining the tolerance distances between the contact and the gate electrode and the contact and the end of the nickel silicide extension.

Reducing the active region size further improves semiconductor performance by lowering source/drain capacitance.

A further aspect of the present invention relates to a semiconductor device that includes a silicon substrate, polysilicon gate electrode, sidewall spacers, source/drain regions, and nickel silicide extensions on which contacts are landed in accordance with tolerance distances between the contact and the gate electrode and the contact and the end of the nickel silicide extension. The nickel silicide extensions are formed by applying a mask with openings over field oxide areas in the silicon substrate adjacent to the outside edges of the source/drain regions, implanting Si into the exposed portions of the field oxide areas, depositing nickel over the wafer, heating the wafer to react the nickel with Si from the gate electrode, source/drain regions and Si-implanted field oxide areas to form a nickel silicide layer on the gate electrode, nickel silicide layers on the source/drain regions and nickel silicide extensions on the field oxide areas implanted with Si, removing unreacted nickel from the wafer, and landing contacts, in whole or in part, on the nickel silicide extensions.

Other advantages of the present invention will become readily apparent to those skilled in the art from the following detailed description. The embodiments shown and described provide illustration of the best mode contemplated for carrying out the invention. The invention is capable of modifications in various obvious respects, all without departing from the invention.

Accordingly, the drawings are to be regarded as illustrative in nature, and not as restrictive.

BRIEF DESCRIPTION OF THE DRAWINGS

Reference is made to the attached drawings, wherein elements having the same reference numeral designations represent like elements throughout.

DETAILED DESCRIPTION OF THE INVENTION

Figure 1:
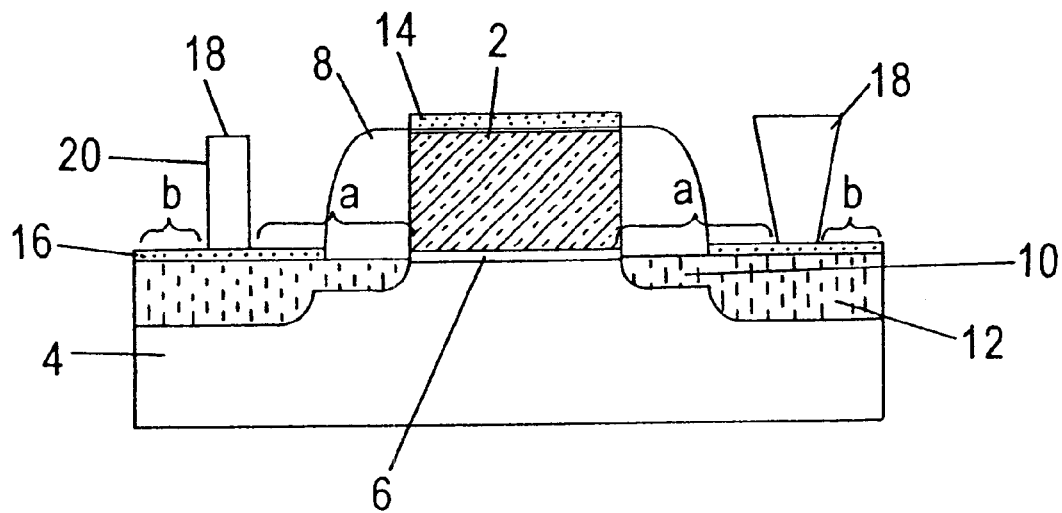
FIG. 1 illustrates a cross-section of a semiconductor transistor where contacts are landed on a nickel silicide layer on the source/drain regions.

The present invention addresses and solves problems related to landing contacts on a semiconductor wafer. The ability to improve density by shrinking device geometries into the deep sub-micron regime is limited by the size at which the active regions must be maintained in order to enable the formation of the desired contact junction and the landing of contacts at the proper tolerance distance from the gate electrode. For example, adverting to FIG. 1, in order to form a transistor, a gate electrode 2 is formed on silicon substrate 4 with a gate insulating layer 6 therebetween. A conformal layer of silicon nitride is then deposited followed by anisotropic etching to form silicon nitride sidewall spacers 8. After anisotropic etching, contaminants such as etching residues are removed by wet cleaning. Shallow source/drain extensions 10 and source/drain regions 12 are formed in a conventional manner. A nickel silicide layer 14 is formed on the upper surface of gate electrode 2 and a layer of nickel silicide 16 is formed on associated source/drain regions 12 by depositing Ni over the wafer surface and subjecting the wafer to heating, e.g., rapid thermal annealing or furnace annealing, to react Ni with the underlying Si. Contacts 18 are landed on nickel silicide layers 16 on the source/drain regions 12, placed at a tolerance distance "a" from the gate electrode 2 and a related tolerance distance "b" from the outer contact edge 20.

Figure 2:
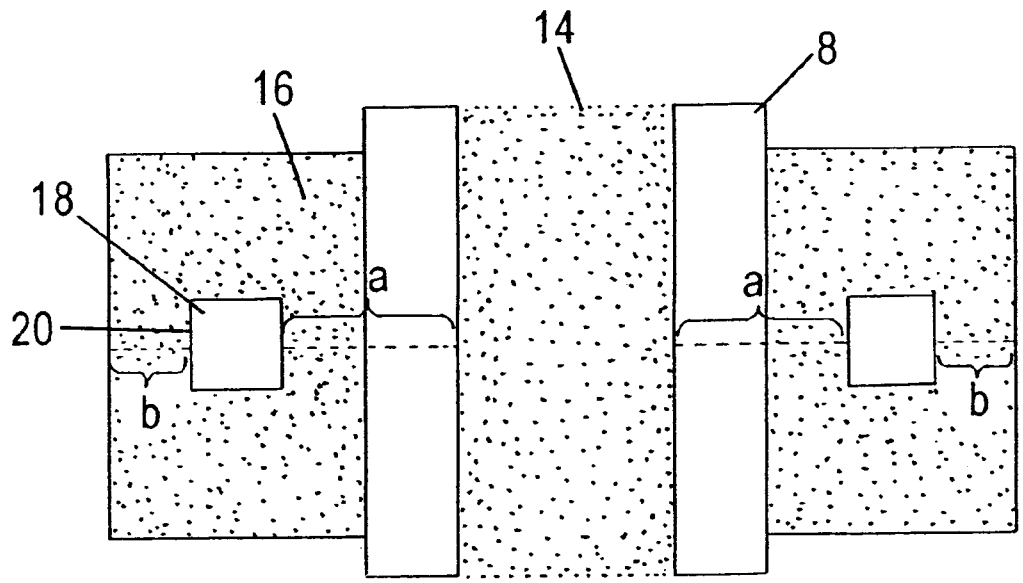
FIG. 2 is a top view of the semiconductor transistor depicted in FIG. 1.

FIG. 2 depicts a top view of the transistor depicted in FIG. 1, wherein similar features bear similar reference numerals.

In order to ensure the formation of the desired contact junction and that the local interconnect functions properly using conventional methods, the contact 18 must be properly landed and aligned on the nickel silicide layer 16 on the source/drain regions 12. The contacts 18, therefore, consume space on the silicide-covered source/drain regions 12 that limit the ability to reduce the overall size of the transistor by reducing the size of the source/drain regions 12.

In conventional nickel silicidation processes, heating is conducted at a temperature of about 400° C. or greater. This temperature level is required to drive the reaction between the deposited Ni and underlying Si to form low resistivity nickel silicide, e.g., NiSi, versus high resistivity nickel silicides, e.g., $Ni_2Si$, on the upper surface of gate electrode 2 and on associated source/drain regions 12. However, it was found that at such temperatures, the deposited nickel will creep out of the active regions, e.g., the source/drain regions 12, to bond with free Si from areas near the active region to form nickel silicide.

After considerable experimentation and investigation, it was postulated that the source/drain regions could be reduced in size by landing the contacts on a nickel silicide layer that extends from the source/drain regions onto Si-rich field oxide areas. The present invention addresses and solves problems generally encountered with reduced dimensions and accommodating contacts by implanting Si in the field oxide areas. As a result, Si creeps from the source/drain regions and bonds with the deposited Ni, thereby forming nickel silicide extensions on which the contacts may be landed at predetermined design tolerance distances from the gate electrode while reducing the size of the underlying source/drain regions.

In accordance with an embodiment of the present invention, Si is implanted into the field oxide areas adjacent to the outside edges of the source/drain regions prior to Ni deposition and annealing. It was found that the Si implants advantageously catalyze the reaction between deposited Ni and Si and causes the nickel silicide, e.g., NiSi, to beneficially creep out of the active regions onto the Si-implanted field oxide areas to form nickel silicide, e.g., NiSi, extensions on which contacts may be landed.

An embodiment of the present invention is illustrated in FIGS. 3 through 6, wherein similar reference numerals denote similar features. Adverting to FIG. 3, a gate electrode 2, e.g., doped polycrystalline silicon, is formed on silicon substrate 4, which can be n-type or p-type doped silicon, with a gate insulating layer 6 therebetween. Gate insulating layer 6 is typically silicon dioxide formed by thermal oxidation or chemical vapor deposition (CVD). Sidewall spacers 8, e.g., silicon nitride or silicon oxide sidewall spacers, are formed in accordance with conventional methods.

With the sidewall spacers 8 in place, using conventional masking and implantation technologies, Si ions are implanted in targeted exposed areas of the silicon substrate 4, e.g., the field oxide areas 22 adjacent to the outer edges 26 of the source/drain regions 12, to create a Si ion distribution 24.

The Si ions are typically implanted at an implantation dosage of approximately $1E14/cm^2$ to approximately $1E15/cm^2$, e.g., $1E15/cm^2$, and an implantation energy between about 20 keV to about 70 keV, for example between about 30 keV to about 60 keV, e.g., about 40 keV to about 50 keV.

Figure 3:
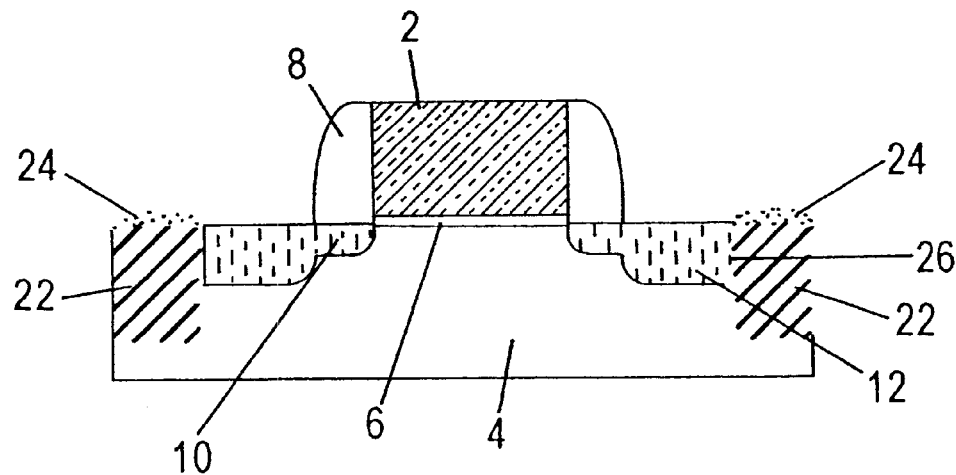
FIGS. 3–6 illustrate a method in accordance with an embodiment of the present invention using nickel silicide extensions that enable landing contacts partially on a nickel silicide layer formed on active regions having reduced dimensions, with the remainder of the contacts landing on the nickel silicide extensions.
Figure 4:
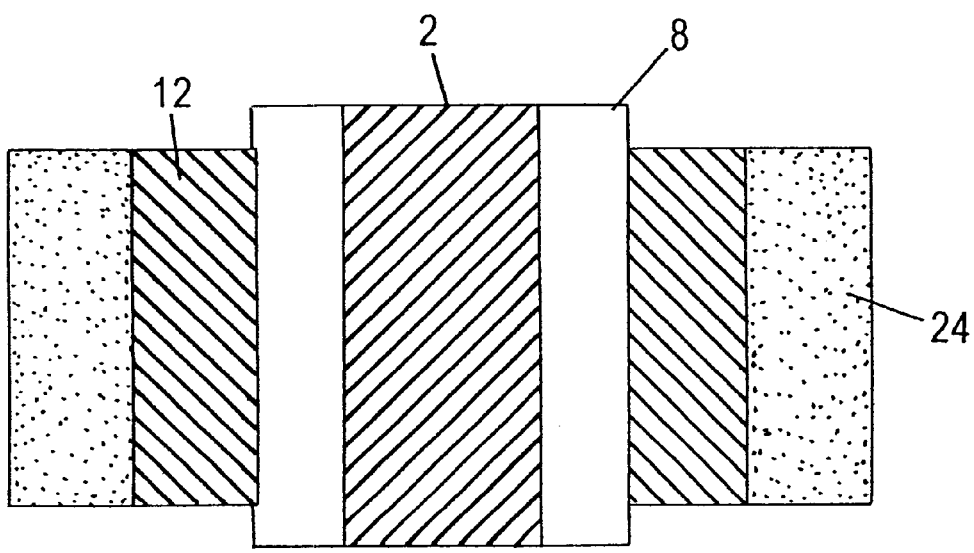

FIG. 4 is a top view of an embodiment of the present invention depicted in FIG. 3.

Figure 5:
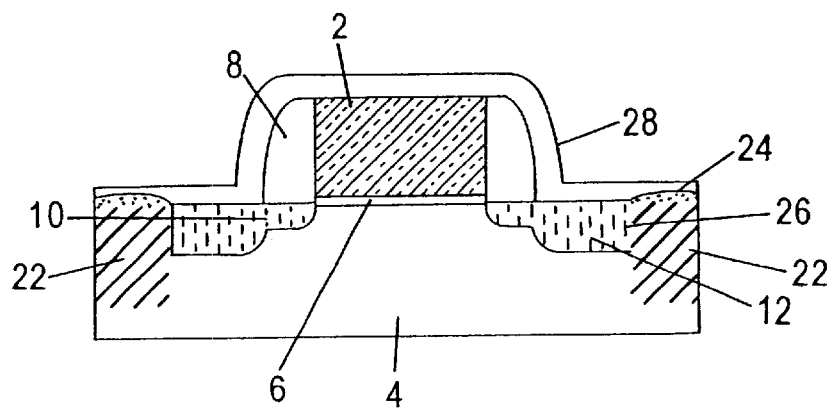

As depicted in FIG. 5, a Ni layer 28 is deposited, as by sputtering in a conventional deposition chamber or other conventional method, over the wafer.

Figure 6:
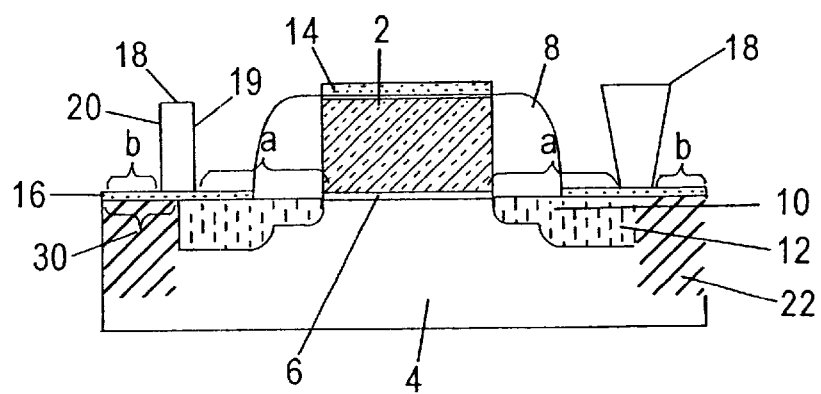

Turning to FIG. 6, in order to achieve the desired nickel silicide layer, e.g., NiSi, and extensions, the wafer is heated, e.g., as by rapid thermal annealing or furnace annealing, at conventional temperatures and for conventional duration, to react the deposited Ni layer 28 with underlying Si to form a nickel silicide layer 14 on the gate electrode 2 and to form nickel silicide layers 16 on the source/drain regions 12 and Si-implanted field oxide areas 22.

Unreacted Ni on the wafer is then easily removed, as by wet chemical stripping. In an embodiment of the present invention, the unreacted Ni is removed by immersing the wafer into a solution of $H_2SO_4$, $H_2O_2$ and water (SPM) or a solution of $NH_4OH$, $H_2O_2$ and water (APM).

As shown in FIG. 6, the NiSi layers 16 extend beyond the outer edges 26 of the source/drain regions 12, thereby forming nickel silicide e.g., NiSi, extensions 30 on the field oxide areas 22 that enable contacts 18 to be landed partially on NiSi layer 16 on the underlying source/drain regions 12 and partially on the nickel silicide extensions 30, while maintaining the predetermined tolerance distance "a" between the inside edge 19 of contact 18 and the gate electrode 2 and a related tolerance distance "b" from the outside contact edge 20 to the end of the nickel silicide extension 30. In an embodiment of the present invention, tolerance distance "a" is approximately twice that of tolerance distance "b."

Figure 7:
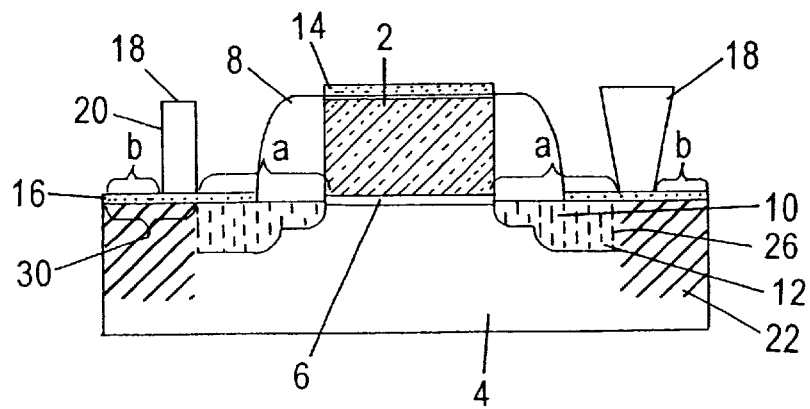
FIG. 7 depicts an embodiment of the present invention where contacts are landed approximately entirely on the nickel silicide extension.

In alternative embodiments of the present invention, contacts 18 may be landed so that some or no portion of contacts 18 are landed on the nickel silicide, e.g., NiSi, layer 16 that is on the source/drain regions 12, e.g., 0% to 99% of contacts 18 are landed on NiSi layer 16 on the source/drain regions 12, with the remainder of contacts 18 landing on the nickel silicide, e.g., NiSi, extensions 30. For example, as depicted in FIG. 6, approximately 50% of contacts 18 are landed on nickel silicide layers 16 on the source/drain regions 12, with the remaining portion of contacts 18 landing on the nickel silicide extensions 30. Alternatively, as depicted in FIG. 7, contacts 18 are landed approximately entirely on nickel silicide extensions 30.

In accordance with embodiments of the present invention, the source/drain region 12 dimensions are reduced by approximately ten percent to approximately seventy percent, e.g., by approximately twenty-five percent to approximately fifty percent, of the dimensions required under particular design rules in the absence of forming the nickel silicide extensions.

It will be appreciated by one skilled in the art that, in an alternative embodiment of the present invention, NiSi layers 16 that extend beyond the source/drain regions 12 over the field oxide area of the silicon substrate 4 can be formed without Si ion implantation in instances where the field oxide is Si-rich. Free Si from the Si-rich area serves as the catalyst to nickel silicide layer 16 formation upon annealing.

Embodiments of the present invention beneficially enable the ability to improve design density by reducing the size of the active areas needed to land contacts. This is achieved by landing contacts, in whole or in part, on the nickel suicide extensions while maintaining the tolerance distances between the contact and the gate electrode and the contact and the end of the nickel silicide extension.

The reduced active region size associated with embodiments of the present invention further improves semiconductor performance by lowering source/drain capacitance.

Another aspect of the present invention relates to a semiconductor device that includes a polysilicon gate electrode 2, source/drain regions 12, and sidewall spacers 8, wherein nickel silicide, e.g., NiSi, layers 14 and 16 are present on the gate electrode 2 and source/drain regions 12. In an embodiment of the present invention, the sidewall spacer 8 comprises silicon nitride. Nickel silicide extensions 30 on field oxide areas 22 are formed by implanting Si ions in exposed portions of the field oxide areas to create a Si ion distribution 24, depositing a Ni layer 28 over the wafer, heating to react the deposited Ni layer 28 with underlying Si in the polysilicon gate electrode 2 and source/drain regions 12 and Si-rich area 24 to form nickel silicide, e.g., NiSi, layers 14 and 16 on the polysilicon gate electrode 2 and the source/drain regions 12 respectively and nickel silicide, e.g., NiSi, extensions 30 on the field oxide areas 22 in the silicon substrate 4 adjacent to the outer edges 26 of the source/drain regions 12, and wet chemical etching the unreacted Ni from the wafer. In accordance with embodiments of the present invention, the source/drain region 12 dimensions are reduced by approximately ten percent to approximately seventy percent, e.g., by approximately twenty-five percent to approximately fifty percent, of the dimensions required under particular design rules in the absence of forming the nickel silicide extensions.

In alternative embodiments of the present invention, some or no portion of contacts 18 are landed on the nickel silicide, e.g., NiSi, layer 16 that is on the source/drain regions 12, e.g., 0% to 99% of contacts 18 are landed on NiSi layer 16 on the source/drain regions 12, with the remainder of contacts 18 landing on the nickel silicide, e.g., NiSi, extensions 30.

The present invention enjoys industrial applicability in fabricating any of various types of semiconductor devices. The present invention has particular applicability in devices with high circuit speeds having design features in the deep sub-micron regime.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein. Wellknown processing structures have not been described in detail in order not to unnecessarily obscure the present invention.

What is claimed is:

1. A method of manufacturing a semiconductor device, the method comprising the steps of:

forming a silicon gate electrode, having an upper surface and side surfaces, overlying a silicon substrate with a gate dielectric layer therebetween, a sidewall spacer disposed adjacent to each side surfaces of the silicon gate electrode, exposed source/drain regions in the silicon substrate, and field oxide areas in the silicon substrate adjacent to the outer edges of the source/drain regions;

implanting silicon (Si) ions into the field oxide areas;

depositing a nickel (Ni) layer;

heating to react the deposited Ni with underlying Si to form a nickel silicide layer on the silicon gate electrode, nickel suicide layers on the source/drain regions and nickel silicide extensions on the field oxide areas;

removing unreacted Ni; and landing a contact on the nickel silicide extensions at a tolerance distance from the silicon gate electrode and a tolerance distance to the end of the nickel silicide extensions.

2. The method of claim 1, wherein the dimensions of the source/drain regions are reduced by approximately ten percent to approximately seventy percent of the dimensions required under particular design rules in the absence of forming the nickel silicide extensions.

3. The method of claim 2, wherein the dimensions of the source/drain regions are reduced by approximately twenty five percent to approximately fifty percent of the dimensions required under particular design rules in the absence of forming the nickel silicide extensions.

4. The method of claim 1, wherein the sidewall spacer comprises silicon nitride.

5. The method of claim 1, comprising implanting Si ions by:

applying a resist mask with openings that expose targeted portions of the field oxide areas; and implanting Si ions into the exposed field oxide areas.

6. The method of claim 5, comprising implanting Si ions at an implantation dosage of approximately $1E14/cm^2$ to approximately $1E15/cm^2$.

7. The method of claim 5, comprising implanting Si ions at an implantation energy of about 20 keV to about 70 keV.

8. The method of claim 1, comprising heating to form the nickel silicide layers on the silicon gate electrode and source/drain regions, and the nickel suicide extensions on the field oxide areas, wherein the nickel silicide layers and the nickel silicide extensions are the low resistivity NiSi form.

9. The method of claim 1, comprising removing the unreacted Ni by wet chemical etching.

10. The method of claim 9, comprising wet chemical etching by immersing the silicon substrate in a solution of $NH_4OH$, $H_2O_2$ and water (APM) or immersing the silicon substrate in a solution of $H_2SO_4$, $H_2O_2$ and water (SPM).

11. The method of claim 1, comprising landing the contact tolerance distance from the silicon gate electrode, whereby the tolerance distance is measured from the outside edge of the silicon gate electrode to the inside edge of the contact.

12. The method of claim 11, comprising landing the contact a tolerance distance to the end of the nickel suicide extension, whereby the tolerance distance is measured from the outside edge of the contact to the end of the nickel silicide extension.

13. The method of claim 12, whereby the tolerance distance from the outside edge of the silicon gate electrode to the inside edge of the contact is approximately twice the tolerance distance from the outside edge of the contact to the end of the nickel silicide extension.

14. The method of claim 1, comprising landing the contact on the nickel silicide extensions, whereby a portion of the contact is landed on the nickel silicide layer on the source/drain regions and the remaining portion of the contact are landed on the nickel suicide extensions.

* * * * *

UNITED STATES PATENT AND TRADEMARK OFFICE
CERTIFICATE OF CORRECTION

PATENT NO.     : 6,440,826 B1
DATED          : August 27, 2002
INVENTOR(S)    : Matthew S. Buynoski It is certified that error appears in the above-identified patent and that said Letters Patent is hereby corrected as shown below:

Column 7,
Line 4, change "surfaces" to -- surface --;
Line 13, change "suicide" to -- silicide --;

Column 8,
Line 8, change "suicide" to -- silicide --;
Line 23, change "suicide" to -- silicide --;
Line 36, change "suicide" to -- silicide --.

Signed and Sealed this

Twenty-eighth Day of January, 2003

JAMES E. ROGAN
*Director of the United States Patent and Trademark Office*